United States Patent [19]
Uesugi et al.

[11] Patent Number: 5,394,829
[45] Date of Patent: Mar. 7, 1995

[54] DEVICE FOR PULLING SILICON SINGLE CRYSTAL

[75] Inventors: Toshiharu Uesugi, Fukui; Koji Mizuishi, Gunma; Atsushi Iwasaki, Fukui; Tadashi Niwayama, Gunma; Tetsuhiro Oda, Fukui, all of Japan

[73] Assignee: Shin-Etsu Handotai Co., Ltd., Tokyo, Japan

[21] Appl. No.: 35,607

[22] Filed: Mar. 23, 1993

[30] Foreign Application Priority Data

Mar. 31, 1992 [JP] Japan .................. 4-105556

[51] Int. Cl.⁶ .............................................. C30B 35/00
[52] U.S. Cl. ..................... 117/217; 117/208; 117/216; 117/222
[58] Field of Search ............ 156/611, 617.1, 618.1, 156/620.4, DIG. 64, DIG. 89, DIG. 90; 422/248, 249

[56] References Cited

U.S. PATENT DOCUMENTS

| | | | |
|---|---|---|---|
| 3,261,671 | 11/1963 | Jonge et al. | 156/617.1 |
| 3,453,352 | 7/1969 | Goundry | 264/93 |
| 4,141,779 | 2/1979 | Hill et al. | 156/617.1 |
| 4,309,241 | 1/1982 | Garavaglia et al. | 156/620.4 |
| 4,415,401 | 11/1983 | Wald et al. | 156/DIG. 89 |
| 4,443,411 | 4/1984 | Kalejs | 156/DIG. 89 |

FOREIGN PATENT DOCUMENTS 1544320 12/1965 Germany .
261554 10/1977 Germany .

Primary Examiner—R. Bruce Breneman
Assistant Examiner—Felisa Garrett
Attorney, Agent, or Firm—Ronald R. Snider

[57] ABSTRACT

A device for pulling a silicon single crystal is constructed so as to preclude deposition of a SiO-derived substance on graphite parts inside the device and prevent the graphite parts from deterioration, elongate the duration of continuous use of the device in a great measure, and simplify the disassembly and reassembly of the device.

This device pulls a silicon single crystal in an atmosphere of inert gas by the Czochralski method, which device is chracterized by comprising a crucible 1 for accommodating a molten silicon mass 2, a heater 3 disposed round the periphery of the crucible 1, an outer member 14 forming a pulling chamber 6 for accomodating the crucible 1, an inert gas inlet part 15 disposed in the upper part of the pulling chamber 6, and an inert gas outlet part 16 separated from the inert gas inlet part 15 in the same upper part of the pulling chamber 6.

11 Claims, 2 Drawing Sheets

DEVICE FOR PULLING SILICON SINGLE CRYSTAL

BACKGROUND OF INVENTION

1. Field of the Invention

This invention relates to a device for pulling a silicon single crystal and more particularly to a device for pulling a silicon single crystal so constructed as to preclude deposition of an unwanted matter on internal members of the device abhorring defilement over a long period of pulling work, elongate the duration of continuous use of the internal members, and simplify the works of cleaning and disassembly of the device.

2. Description of the Prior Art

It is well known that semiconductor elements are produced from substrates which are obtained from a high-purity silicon single crystal bar. The substrates to be used as starting materials for semiconductor integrated circuits, for example, are produced by slicing the high-purity single crystal bar with a diamond blade and subjecting the slices to lapping, etching with a chemical reagent, and polishing to a mirror finish.

In recent years, the advance of semiconductor technologies has come to urge the necessity accurately controlling the dopant concentration, the concentration of impurities other than the dopant, and the density of lattice defects. As a result, a desire has come to be expressed to develop a device to pull the semiconductor single crystal which is capable of effecting the accurate control mentioned above and, at the same time, enabling this accurate control to be carried out continuously over a long time and obviating the necessity of subjecting the device to the works of cleaning and disassembly to the fullest possible extent.

It has been customary to date to adopt the Czochralski method for the work of pulling silicon single crystals. One exmple of the use of this method is illustrated in FIG. 2. In FIG. 2, 1 stands for a crucible for accommodating a molten silicon mass 2, 3 for a heater disposed round the periphery of the crucible 1, 4 for an insulating shield disposed round the periphery of the heater 3, and 5 for a silicon single crystal being pulled.

In the production of a silicon single crystal in accordance with the Czochralski method, a crucible made of quartz is used as the crucible 1. It has been known that oxygen is dissolved out of the quartz crucible, passed into the molten silicon mass, and eventually incorporated in the silicon single crystal.

This phenomenon occurs because the thermal convection of the molten silicon mass accommondated in the quartz crucible and the forced convection arising from the rotation of the crucible in the process of pulling cause the molten silicon mass to act on the quartz crucible and induce a reaction between $SiO_2$ and $Si$, the substances forming the quartz crucible, this reaction gives rise to SiO, this SiO is engulfed temporarily in the molten mass, and the greater part of the engulfed SiO vaporizes from the surface of the molten mass and the remainder thereof passes into the silicon single crystal to be permanently settled therein.

This SiO increases the interstitial oxygen concentration of the silicon single crystal being formed and, in some cases, forms a cause for defects and, in other cases, manifests a gettering effect. Thus, the concentration of the oxygen engulfed in the crystal must be controlled with high accuracy.

When a pulling chamber 6 is formed in a perfectly closed structure, the SiO which vaporizes from the molten silicon mass is re-dissolved into the molten silicon mass and momentarily changes the SiO concentration within the pulling chamber 6. Thus, it becomes difficult to pull a single crystal having a fixed oxygen concentration. In the circumstances, the practice of keeping the SiO concentration in the pulling chamber 6 at a constant level by introducing an inert gas 7 into the pulling chamber 6 and causing the inert gas which is departing from the pulling chamber 6 to entrain the SiO emanating from the molten mass in the pulling chamber 6 is now in vogue.

In the conventional device for pulling a silicon single crystal illustrated in FIG. 2, the inert gas 7 is introduced downwardly through a pulling chamber 6, brought into contact with the surface of the molten silicon mass 2, then passed through a gap 9a formed between the crucible 1 and the heater 3 and a gap 9b formed between the heater 3 and the insulating shield 4, and released via an outlet hole 10 and a valve 11 and out of the system by means of a vacuum pump 12. In this case, a condensate originating in the SiO is deposited in a large amount on the surfaces of the heater 3, and the insulating shield 4.

Since the heater 3 and the insulating shield 4 are made of graphite, they are deteriorated by the deposition thereon of the condensate originating in the SiO or they must be treated for removal of the deposited condensate after service. This treatment entails the disadvantage that the device must be disassembled and reassembled at the expense of much time and labor.

SUMMARY OF THE INVENTION

This invention which has been produced by the urge to solve the problems of the prior art described above is aimed at providing a device for pulling a silicon single crystal so constructed as to preclude the deposition of a condensate originating in the SiO on the parts made of graphite and prevent the graphite parts from being deteriorated by the deposition of the SiO-derived condensate, either eliminate or decrease to an extreme extent the work of removing the deposited condensate from the graphite parts, extend in a great measure the duration of normal operation of the device without requiring the graphite parts to be disassembled or reassembled for cleaning, and minimize the works of disassembly and reassembly of the device and permit enlargement of the device owing to the smallness of the amount of the condensate suffered to be deposited on the graphite parts, and further allow an addition to the diameter of the silicon single crystal bar to be effectively pulled.

BRIEF DESCRIPTION OF THE DRAWINGS

The invention will be better understood and the objects and features thereof other than those set forth above will become apparent when consideration is given to the following detailed description thereof, which makes reference to the annexed drawing wherein.

DETAILED DESCRIPTION OF THE PREFERRED EMBODIMENTS

To be specific, this invention is directed to a divice for pulling a silicon single crystal in an atmosphere of inert gas by the Czochralski method, which device is characterized by comprising a crucible for accommodating a molten silicon mass, a heater disposed round the peripheral of the crucible, an outer member forming a pulling chamber for accommodating the crucible, an inert gas inlet part disposed in the upper part of the pulling chamber, and an inert gas outlet part separated from the inert gas inlet part in the same upper part of the pulling chamber.

Now, this invention will be described more specifically below with reference to accompanying drawings.

Figure 1:
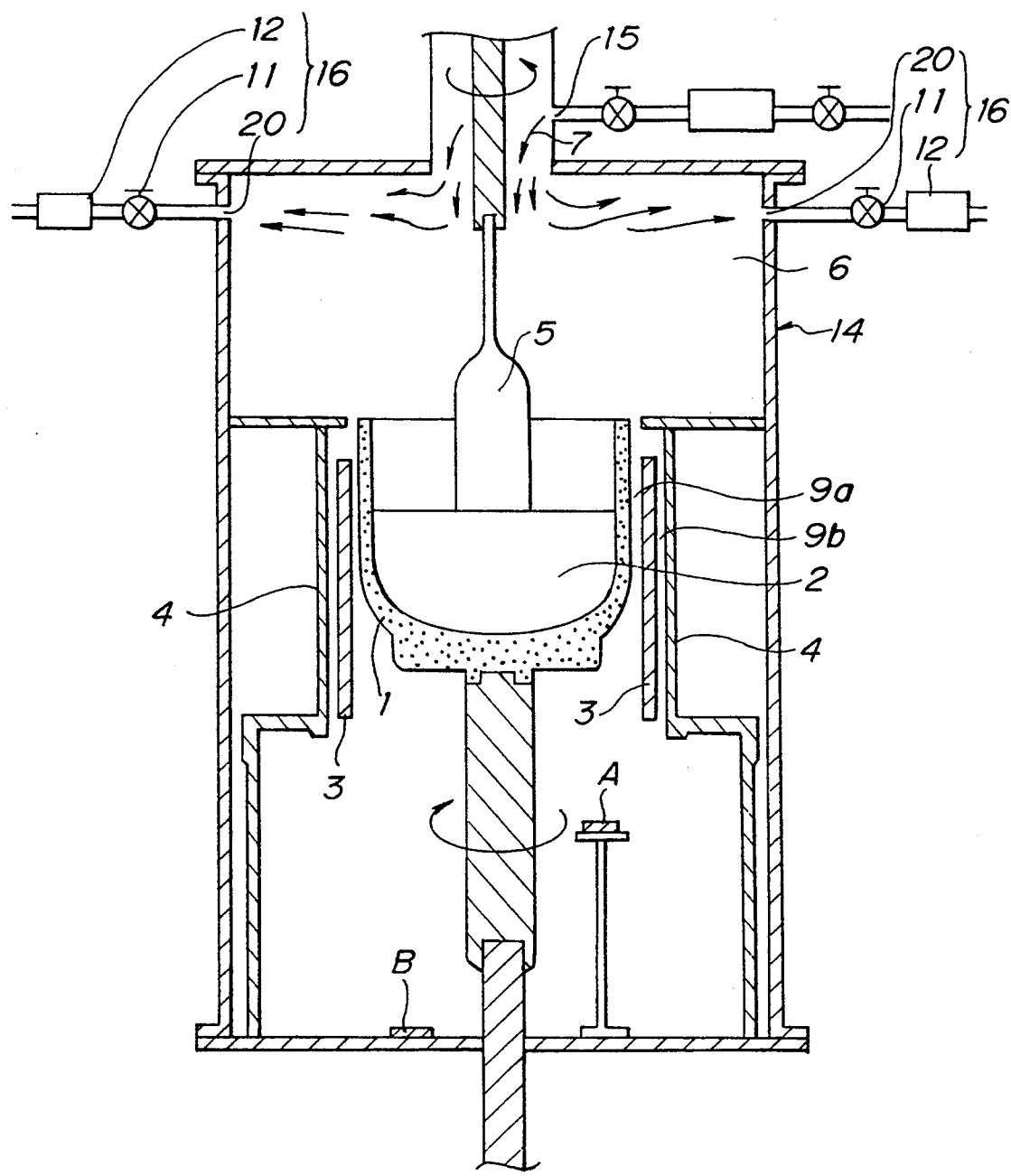
FIG. 1 is a longitudinal cross section schematically illustrating the construction of a device for pulling a silicon single crystal in accordance with this invention.

FIG. 1 is an explanatory diagram illustrating schematically the construction of a device for pulling a silicon single crystal in accordance with this invention.

FIG. 1, 2 stands for a molten silicon mass, 2 for a crucible for accommodating the molten silicon mass 2, 3 for a heater disposed round the periphery of the crucible 1, 6 for a pulling chamber, 14 for an outer member forming the pulling chamber 6, 15 for an inert gas inlet part disposed in the upper part of the interior of the pulling chamber 6, 16 for an inert gas outlet part separated from the inert gas inlet part 15 and disposed at a position above the pulling chamber 6, and 4 for an insulating shield disposed round the periphery of the heater 3.

The inert gas outlet part 16 is composed of a gas outlet hole 20, a vacuum pump 12, and a valve 11 and is controlled so as to assume a pressure slightly lower than the air pressure inside the pulling chamber 6. This construction gives rise to a current of gas from the pulling chamber 6 to the inert gas outlet part 16.

The growth of a crystal is initiated by immersing a seed crystal (not shown) in the molten silicon mass 2 accommodated in the crucible 1 made of quartz and rotating the crucible 2 and the seed crystal thereby inducing deposition of silicon on the seed crystal. At this point, the molten silicon mass 2 held inside the crucible 1 generates a thermal convection owing to the lack of uniform density due to a temperature difference caused by heating and also generates a forced convection in consequence of the rotation of the crucible 1 and the silicon single crystal 5. By virtue of these convections, the molten silicon mass 2 rubs against the wall surface of the crucible 1 and consequently dissolves the inner skin of the crucible 1 of quartz and occludes oxygen from the dissolved quartz. The interior of the pulling chamber 6 is vacuumized to a level below 100 mbar and enabled to draw in the inert gas 7 such as, for example, argon gas via the inert gas inlet part disposed in the upper part of the pulling chamber.

The oxygen engulfed in the molten silicon mass 2 is vaporized in the form of SiO.

The inert gas 7 introduced from above the pulling chamber 6 is discharged through the inert gas outlet part 16 in conjunction with the SiO emanating inside the pulling chamber 6.

Since the inert gas inlet part is disposed in the upper part of the pulling chamber and the inert gas outlet part is separated from the inert gas inlet part mentioned above and disposed at a position above the pulling chamber, the inert gas flowing from the inert gas inlet part to the inert gas outlet part forms a current of itself in the upper part of the pulling chamber and this current of the inert gas avoids contacting the internal mambers of the pulling chamber which abhor defilement. The SiO which emanates from the molten silicon mass inside the crucible and diffuses in the upper part of the pulling chamber, therefore, is discharged through th inert gas outlet part as entrained by the current of inert gas mentioned above. Here, the probability of the SiO colliding against the surfaces of the internal members of the pulling chamber en route to the upper part of the pulling chamber is very small and consequently the depositon of the condensate originating in the SiO on the graphite members in the pulling chamber is greatly curbed because the SiO vaporizes gently from the molten silicon mass and further because the cross-sectional area of the path of SiO directed toward the upper part of the pulling chamber is very large.

Now, this invention will be described more specifically below with reference to working examples.

EXAMPLE 1

By the use of a single crystal pulling device constructed as illustrated in FIG. 1, a silicon single crystal bar having a diameter of 4 inches and an axial bearing of <100> was pulled.

A crucible 1 made of quartz had an inside diameter of 14 inches and the internal pressure of a pulling chamber 6 was kept at 100 mbar. A silicon single crystal 5 was pulled with the quartz crucible 1 rotated at a rate of 8 rpm and the seed crystal at 25 rpm in mutually opposite directions. As the inert gas, argon was introduced at a flow rate of 110 Nl/min into the pulling chamber 6. To compare the amounts of SiO to be deposited, graphite discs measuring 100 mm in diameter and 5 mm in thickness were left standing at the position A and B shown in FIG. 1.

Under these conditions, the pulling operation was carried out for durations of 69.67 hours. After the operation, the graphite discs A and B and a heater 3 shown in FIG. 1 were weighed to determine whether or not the operation resulted in increasing their weights.

The graphite discs A and B and the heater 3 showed no increase in weight, indicating that no deposition of SiO occurred during the pulling operation.

When the silicon single crystal produced by the pulling operation was tested for oxygen concentration by the FT-IR (Fourier-transform Infrared Spectroscopy), the oxygen concentration was found to be about 0.5 pmma lower than that of the crystal produced in Comparative Experiment 1 shown below.

The defects (OSF density) in the silicon single crystal were equal to or slightly lower than those of the crystal of the comparative experiment and the carbon concentration was not discernibly different from that of the comparative experiment.

Comparative Experiment 1

Figure 2:
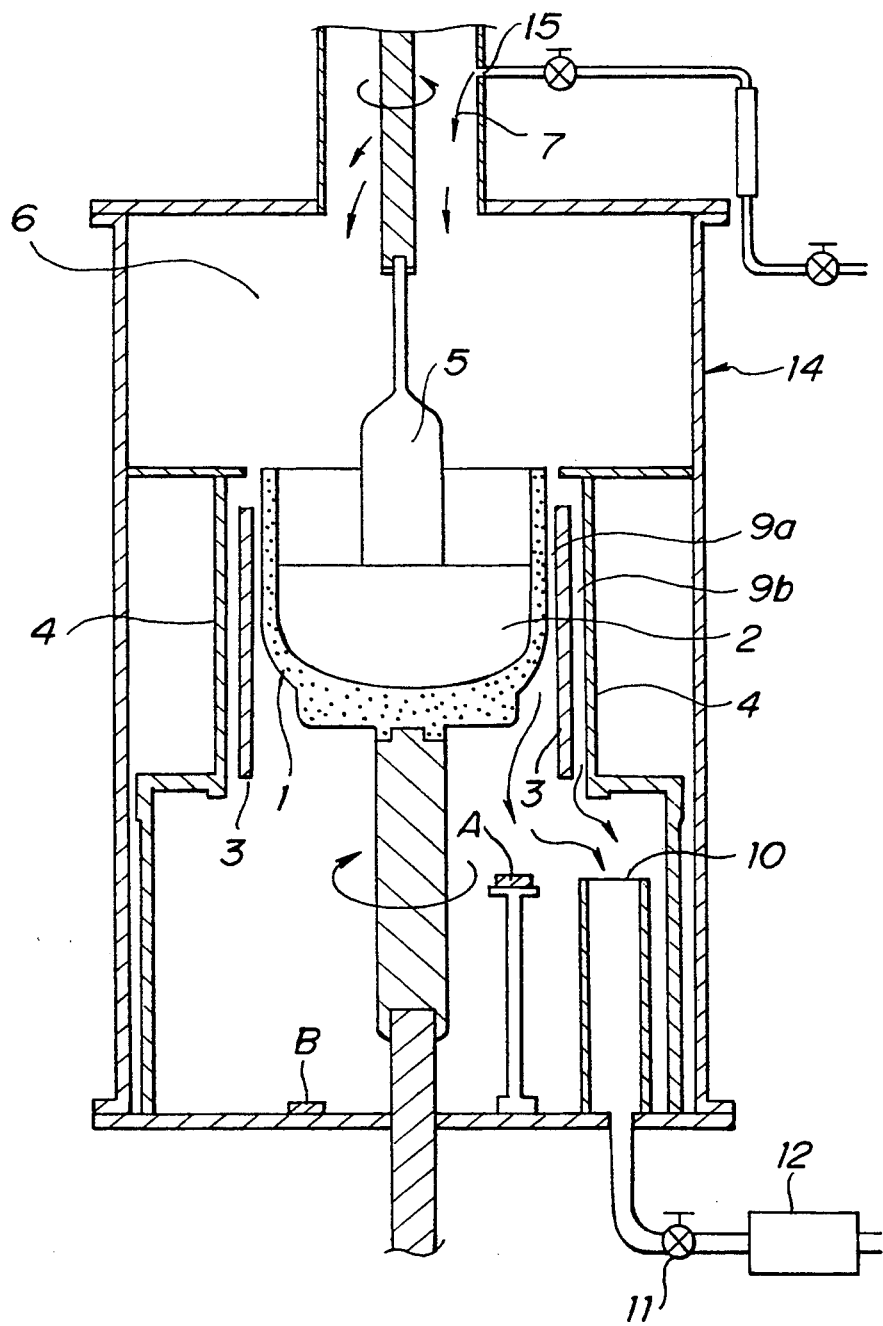
FIG. 2 is a longitudinal cross section schematically illustrating a conventional device for pulling a silicon single crystal.

A silicon single crystal was pulled by repeating the procedure of Example 1, excepting a conventional silicon single crystal pulling device constructed as illustrated in FIG. 2 was used instead.

The pulling operation was carried out for durations of 26.67 hours. After the pulling operation, graphite discs A and B and a heater 3 shown in FIG. 2 were weighed to determine whether or not the operation resulted in increasing their weights. While the heater 3 showed no increase of weight, the graphite disc A showed an increase of 46.4 mg and the graphite disc B an increase of 3.3 mg.

As clearly noted from the description given thus far, the silicon single crystal pulling device of this invention is provided with the inert gas inlet part disposed in the upper part of the pulling chamber and the inert gas outlet part separated from the inert gas inlet part and disposed at a position above the pulling chamber. Owing to this arrangement of the inert gas inlet part and the inert gas outlet part, the inert gas flowing from the inert gas inlet part to the inert gas outlet part forms a current of its own in the upper part of the pulling chamber and this current of inert gas avoids contacting the internal members of the pulling chamber which abhor defilement and, as a result, the SiO emanating from the molten silicon massin the crucible and diffusing in the upper part of the pulling chamber is discharged through the inert gasoutlet part as entrained by the current mentioned above and is enabled to preclude the deposition of the condensate originating in the SiO on the internal members of the pulling chamber such as graphite membersand, at the same time, prevent these internal members from being deteriorated by the deposition of the condensate originating in the SiO. As a consequence, the work of removing the deposited condensate from the internal members of the pulling device is either completely eliminated or decreased to an extreme extent and the duration of continuous operation of the pulling device without requiring the work of disassembling and ressembling can be elongated in a great measure. Further, since the deposition of the condensate originating in the SiO occurs on only a very few internal members of the device, the work of disassembling and reassembling the device can be simplified and the device is allowed to be enlarged and, at the same time, the diameter of the silicon single crystal bar which can be produced by pulling can be increased. These advantages of the silicon single crystal pulling device can be attained without any sacrifice of the quality of the single crystal bar to be produced.

What is claimed is:

1. A device for pulling a silicon single crystal in an atmosphere of inert gas by the Czochralski method, which device comprises:
   a crucible form accommodating a molten silicon mass,
   a heater disposed around the periphery of said crucible,
   an outer member forming a pulling chamber for accommodating said crucible,
   an inert gas inlet part disposed in the upper part of said pulling chamber, and
   an inert gas outlet part separated from said inert gas inlet part in the same upper part of said pulling chamber;
   wherein said inert gas inlet part is disposed at the center of the upper part of said pulling chamber and said inert gas outlet part is disposed at a corner of the upper part of said pulling chamber.

2. A device according to claim 1, wherein said inert gas inlet part is disposed in said pulling chamber and inert Gas outlet parts are severally disposed at two or more portions of said pulling chamber.

3. A device according to claim 2, wherein said inert gas outlet parts disposed severally at two or more portions of said pulling chamber are positioned symmetrically relative to the axis of said pulling chamber so as to give rise to a plurality of pairs of gas outlet parts.

4. A device for pulling a silicon single crystal in an atmosphere of inert gas by the Czochralski method, which device comprises:
   a crucible form accommodating a molten silicon mass,
   a heater disposed around the periphery of said crucible,
   an outer member forming a pulling chamber for accommodating said crucible,
   an inert gas inlet part disposed in the upper part of said pulling chamber, and
   an inert gas outlet part separated from said inert gas inlet part in the same upper part of said pulling chamber; wherein
   said same upper part is a continuous surface, and said inert gas flows radially from said inlet part to said gas outlet part, and
   wherein said continuous surface is flat.

5. A device according to claim 4, wherein said inert gas inlet part is disposed at the center of the upper part of said pulling chamber and said inert gas outlet part is disposed at a corner of the upper part of said pulling chamber.

6. A device according to claim 4 wherein said inert gas inlet part is disposed in said pulling chamber and inert gas outlet parts are severally disposed at two or more portions of said pulling chamber.

7. A device according to claim 4, wherein said inert gas outlet parts disposed severally at two or more portions of said pulling chamber are positioned symmetrically relative to the axis of said pulling chamber so as to give rise to a plurality of pairs of gas outlet parts.

8. A device for pulling a silicon single crystal in an atmosphere of inert gas by the Czochralski method, which device comprises:
   crucible form accommodating a molten silicon mass,
   heater disposed around the periphery of said crucible,
   an outer member forming a pulling chamber for accommodating said crucible,
   an inert gas inlet part disposed in the upper part of said pulling chamber, and
   an inert gas outlet part separated from said inert gas inlet part in the same upper part of said pulling chamber; wherein
   said same upper part is a continuous surface, and said inert gas flows radially from said inlet part to said gas outlet part, and
   wherein said inert gas inlet part is disposed at the center of the upper part of said pulling chamber and said inert gas outlet part is disposed at a corner of the upper part of said pulling chamber.

9. A device for pulling a silicon single crystal in an atmosphere of inert gas by the Czochralski method, which device comprises:
   a crucible form accommodating a molten silicon mass,
   a heater disposed around the periphery of said crucible,
   an outer member forming a pulling chamber for accommodating said crucible,
   an inert gas inlet part disposed in the upper part of said pulling chamber, and
   an inert gas outlet part separated from said inert gas inlet part in the same upper part of said pulling chamber; wherein
   said same upper part is a continuous surface, and said inert gas flows radially from said inlet part to said gas outlet part, and wherein said inert gas outlet parts disposed severally at two or more portions of said pulling chamber are positioned symmetrically relative to the axis of said pulling chamber so as to give rise to a plurality of pairs of gas outlet parts.

10. A device for pulling a silicon single crystal in an atmosphere of inert gas by the Czochralski method, which device comprises:

a crucible form accommodating a molten silicon mass, a heater disposed around the periphery of said crucible, an outer member forming a pulling chamber for accommodating said crucible, an inert gas inlet part disposed in the upper part of said pulling chamber, and an inert gas outlet part separated from said inert gas inlet part in the same upper part of said pulling chamber; wherein said same upper part allows unobstructed gas flow from said inlet to said outlet, and wherein said inert gas inlet part is disposed at the center of the upper part of said pulling chamber and said inert gas outlet part is disposed at a corner of the upper part of said pulling chamber.

11. A device for pulling a silicon single crystal in an atmosphere of inert gas by the Czochralski method, which device comprises:

a crucible form accommodating a molten silicon mass, a heater disposed around the periphery of said crucible, an outer member forming a pulling chamber for accommodating said crucible, an inert gas inlet part disposed in the upper part of said pulling chamber, and an inert gas outlet part separated from said inert gas inlet part in the same upper part of said pulling chamber; wherein said same upper part allows unobstructed gas flow from said inlet to said outlet, and wherein said inert gas outlet parts disposed severally at two or more portions of said pulling chamber are positioned symmetrically relative to the axis of said pulling chamber so as to give rise to a plurality of pairs of gas outlet parts.

* * * * *